(12) United States Patent
Li et al.

(10) Patent No.: US 7,180,716 B2
(45) Date of Patent: Feb. 20, 2007

(54) FABRICATION METHOD FOR AN IN-STACK STABILIZED SYNTHETIC STITCHED CPP GMR HEAD

(75) Inventors: Min Li, Dublin, CA (US); Youfeng Zheng, San Jose, CA (US); Kunliang Zhang, Santa Clara, CA (US); Simon Liao, Fremont, CA (US); Kochan Ju, Monte Sereno, CA (US)

(73) Assignee: Headway Technologies, Inc., Milpitas, CA (US)

( * ) Notice: Subject to any disclaimer, the term of this patent is extended or adjusted under 35 U.S.C. 154(b) by 443 days.

(21) Appl. No.: 10/812,695

(22) Filed: Mar. 30, 2004

(65) Prior Publication Data

US 2005/0219773 A1 Oct. 6, 2005

(51) Int. Cl.
*G11B 5/39* (2006.01)
*G11B 11/127* (2006.01)

(52) U.S. Cl. .................. 360/324.12; 360/324.11; 29/603.08; 428/811.5

(58) Field of Classification Search ........... 360/324.12; 29/603.08
See application file for complete search history.

(56) References Cited

U.S. PATENT DOCUMENTS

| | | | |
|---|---|---|---|
| 5,627,704 A | 5/1997 | Lederman et al. ......... 360/113 |
| 5,668,688 A | 9/1997 | Dykes et al. ............... 360/113 |
| 6,466,419 B1 | 10/2002 | Mao ....................... 360/324.12 |
| 6,473,279 B2 | 10/2002 | Smith et al. ........... 360/324.12 |
| 6,747,852 B2 * | 6/2004 | Lin et al. ............... 360/324.12 |
| 6,781,801 B2 * | 8/2004 | Heinonen et al. ........ 360/324.2 |
| 6,829,161 B2 * | 12/2004 | Huai et al. .................. 365/158 |
| 7,045,224 B2 * | 5/2006 | Hasegawa et al. ........ 428/811.5 |
| 2003/0053269 A1 | 3/2003 | Nishiyama ............... 360/324.1 |
| 2003/0143431 A1 | 7/2003 | Hasegawa ................... 428/692 |

* cited by examiner

*Primary Examiner*—Angel Castro
*Assistant Examiner*—Christopher R. Magee
(74) *Attorney, Agent, or Firm*—Saile Ackerman LLC; Stephen B. Ackerman

(57) ABSTRACT

A method for fabricating a stitched CPP synthetic spin-valve sensor with in-stack stabilization of its free layer. The method can also be applied to the formation of a stitched tunneling magnetoresistive sensor. The free layer is strongly stabilized by magnetostatic coupling through the use of a longitudinal biasing formation that includes a ferromagnetic layer, denoted LBL, within the pillar portion of the sensor and a synthetic exchange coupled tri-layer within the stitched portion of the sensor. The tri-layer consists of two ferromagnetic layers, FM1 and FM2 separated by a coupling layer and magnetized longitudinally in antiparallel directions. A criterion for the magnetic thicknesses of the layers: [t(LBL)+t(FM1)]/t(FM2)=70/90 angstroms of CoFe insures a strong exchange coupling. The magnetization of the tri-layer is done in a low field anneal that does not disturb the previous magnetization of the ferromagnetic free layer.

10 Claims, 5 Drawing Sheets

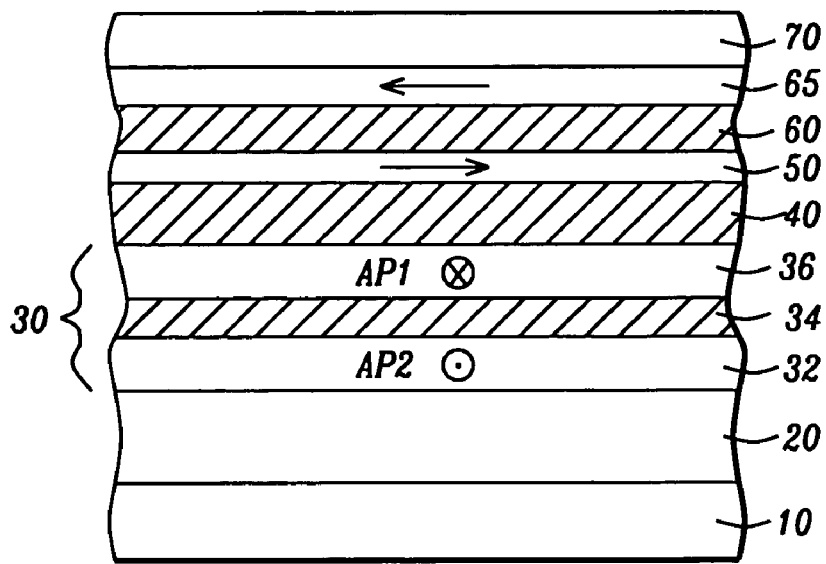
FIG. 1a – Prior Art
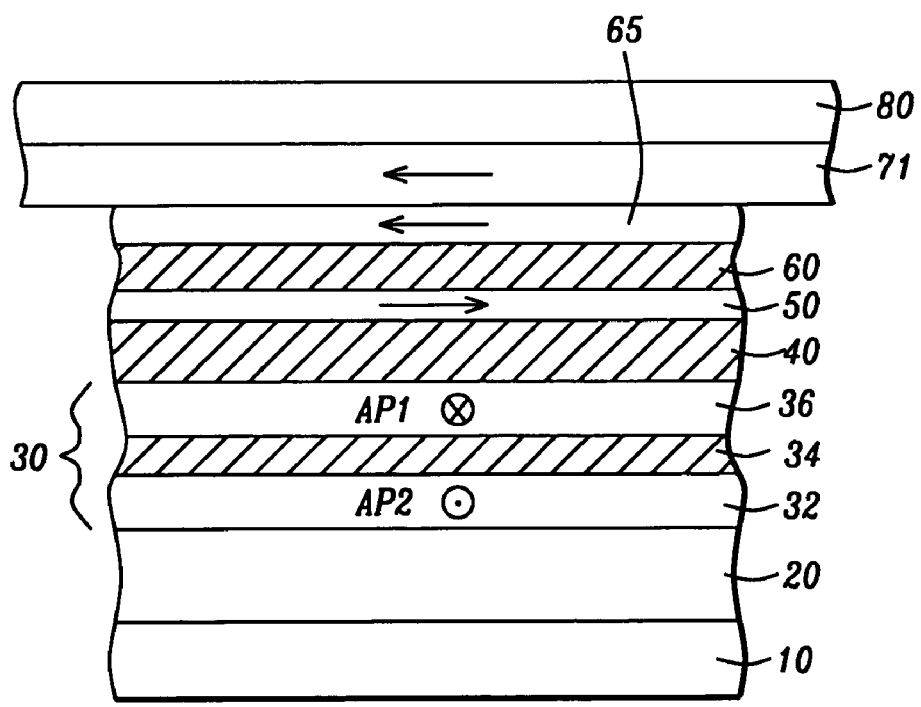
FIG. 1b – Prior Art

FABRICATION METHOD FOR AN IN-STACK STABILIZED SYNTHETIC STITCHED CPP GMR HEAD

BACKGROUND OF THE INVENTION

1. Field of the Invention

This invention relates generally to the fabrication of a giant magnetoresistive (GMR) magnetic field sensor in the current-perpendicular-to-plane (CPP) configuration, more specifically to the stabilization of the magnetization of the free layer of such a sensor.

2. Description of the Related Art

The synthetic (Sy) spin-valve (SV) giant magnetoresistive (GMR) sensor is a multi-layered configuration of magnetic and non-magnetic layers which includes a magnetically free layer, whose magnetic moment is free to respond to outside magnetic stimuli, separated by a non-magnetic layer from a magnetically "pinned" layer, whose magnetic moment is fixed in direction. The motion of the free layer magnetic moment relative to the pinned layer magnetic moment changes the resistance of the sensor so that a "sense" current passing through the layers produces measurable voltage variations across the sensor. The adjective "synthetic," applied to the sensor refers to the structure of the pinned layer which is formed as two layers of ferromagnetic material, magnetized in opposite directions, and held in that antiparallel configuration by a non-magnetic layer of material placed between them. The separation of the two layers by the proper distance (and proper material) produces an exchange coupling between their magnetic moments which is energetically preferentially anti-parallel, so the resulting tri-layer is called a "synthetic antiferromagnetic" layer. The synthetic tri-layer is typically formed on a "pinning" layer of legitimately antiferromagnetic material, which serves to hold the entire structure in a stable configuration of its magnetic moments.

The synthetic spin valve is presently fabricated in two basic configurations, current perpendicular to plane (CPP) and current in plane (CIP), which differ basically in the path taken by the sense current as it passes through the sensor stack (ie. its configuration of layers). As can be inferred from the terminology, the sense current in the CPP configuration passes vertically, from top to bottom, perpendicularly to the planes of the stack layers. In the CIP configuration, the current passes horizontally, from side to side, within the planes of the stack layers.

One of the problems associated with the design of a good spin valve sensor is the stabilization of its magnetically free layer. In general, the magnetization of the free layer would be fragmented into a multiplicity of domains. This domain structure is not fixed in time, however, but moves randomly as a result of thermal agitation and/or external fields, leading to a form of noise in the sensor signal called Barkhausen noise. It is, therefore, desirable to maintain the free layer in a single domain state, which would be much less subject to agitation and this process is called stabilization. Since the magnetization of the free layer is typically directed "longitudinally" (within the plane of the layer and within the plane of the air-bearing-surface (ABS) of the sensor), whereas the magnetization of the pinned layer is directed transversely to the ABS plane, the stabilization of the free layer is accomplished by what is called a "longitudinal bias layer (LBL) (or biasing layer)." In the CIP configuration, the longitudinal biasing layer is formed as two layers, one on either side of the stack configuration. These layers are generally permanent magnets (called "hard bias"), which couple magnetostatically to the lateral edges of the free layer and produce the single domain. Since the sense current must go through the plane layers from one side to the other, the biasing layers, which are typically conductors, do not impede the operation of the sensor. It must be pointed out, however, that as the width of the sensor (its "trackwidth") becomes narrower, the longitudinal biasing effect of the laterally positioned magnets can actually impede the free movement of the free layer magnetic moment as it responds to external magnetic fields. For this reason, among others, alternative forms of longitudinal biasing have been developed.

In the CPP configuration, however, placing conducting permanent magnets on each side of the layer configuration produces an even more severe and immediate problem, since the magnets would give the sense current a pathway that bypasses the sensor configuration. Although this problem can be ameliorated by placing insulating layers between the biasing layers and the sensor, this solution increases the difficulties of fabricating the sensor. Therefore, an alternative biasing configuration, called "in-stack stabilization," has been used, in which a biasing layer is formed over the free layer, rather than to either side of it. Since all layers have a common horizontal cross-section, this allows the entire configuration to be formed in a self-aligned scheme, making the fabrication process relatively simple. The in-stack approach is discussed in great detail in Smith et al. (U.S. Pat. No. 6,473,279 B2). Smith et al. teach the formation of an a first auxiliary ferromagnetic layer above the free layer which couples antiferromagnetically to the free layer by means of exchange coupling (RKKY coupling) across a non-magnetic coupling layer and a second auxiliary exchange pinning layer, which exchange pins the first auxiliary layer.

Mao (U.S. Pat. No. 6,466,419 B1) teaches a CPP spin valve structure wherein a spacer layer is formed on the free layer and a biasing layer of antiferromagnetic material is formed on the spacer layer. In addition, to prevent unwanted side readings by the free layer, the entire configuaration is laterally covered by an insulation layer and then covered by a concave shield.

Nishiyama (U.S. Patent Application Publication No.: US 2003/0053269 A1) teaches a method of forming a CPP in which the lateral sides of the CPP stack are sloped to the vertical and have two different slope angles, this configuration being claimed to prevent shorting between the stack layers and the upper and lower electrodes. In addition, the ferromagnetic free layer of the sensor is exchange coupled in an antiferromagnetic configuration with an additional ferromagnetic layer formed above it and separated from it by a non-magnetic layer.

Hasegawa (U.S. Patent Application Publication No.: US 2003/0143431 A1) discloses a CPP configuration of two stacked dual spin valve sensors, each of the dual spin valve sensors including a free layer positioned between an upper and lower synthetic pinned layer. A hard magnetic layer sandwiched between the two dual spin valves serves as an in-stack biasing layer.

An alternative in-stack configuration, called a "stitched" in-stack configuration, has been developed for the purpose of broadening the current profile in the antiferromagnetic layer which is used to pin the longitudinal biasing layer. Referring to FIG. 1a, there is seen a basic (non-stitched) bottom spin valve CPP stack having a uniform horizontal cross-section of its layers, a so-called "pillar" stack formation. Moving vertically from the bottom up, there is seen a seed layer (10), a first antiferromagnetic (AFM) pinning layer (20), a synthetic antiferromagnetic (SyAF) pinned layer (30) which is a tri-layer formed of a first ferromagnetic layer (32), denoted "AP2 (for antiparallel magnetization), a non-magnetic coupling layer (34) and a second ferromagnetic layer (36), denoted AP1. The magnetizations of (32) and (34) are antiparallel and out of the plane of the figure (the ABS plane) as shown by the arrowhead and arrowtail symbols. A non-magnetic spacer layer (40) separates the SyAF from the ferromagnetic free layer (50). The ferromagnetic free layer is formed on the spacer layer. A non-magnetic coupling layer (60) (more correctly termed a decoupling layer) is formed on the ferromagnetic free layer and a ferromagnetic longitudinal biasing layer (65) is formed on the coupling layer. The role of the decoupling layer (60) is to separate the biasing and free layers sufficiently to avoid exchange coupling and also to mix the spins of the electrons so that the biasing layer (65) plays no role in determining the GMR properties of the stack. The magnetization directions of the free layer and the biasing layer are set longitudinally in opposite directions and the magnetization of the biasing layer is pinned by an antiferromagnetic (AFM) layer (70) formed on the biasing layer. It is shown by simulation analysis that the magnetic thickness (product of the magnetic moment and actual thickness) of the biasing layer must be approximately 1.5 to 2 times that of the free layer for sufficient stabilization to occur.

Referring to FIG. 1b, there is shown the (prior art) stitched configuration of the CPP sensor. This form is identical to the non-stitched version except that after the foregoing layers (10)–(65) are patterned to a uniform horizontal cross-section, ie the pillar portion of the sensor, a second portion of a longitudinal bias layer (71) of greater horizontal cross sectional area is then "stitched" onto the first portion (65) and an antiferromagnetic pinning layer (80), of substantially equal area, is formed on the stitched portion of the bias layer. The stitched bias layer is coupled to the free layer and is pinned by the AFM pinning layer. The extended cross-sectional area of the AFM layer (80) allows a broader horizontal current distribution (more uniform current profile) and a more uniform current through the remainder of the stack, thereby improving the sensor performance by allowing higher sense current through the sensor and as measured by the GMR ratio. In addition, the stitched configuration also improves the exchange coupling of the longitudinal bias layer. In the pillar design, the coupling between the bias layer and the free layer is ferrimagnetic to ferromagnetic coupling, whereas in the stitched design, the coupling within the neck area is ferromagnetic to ferromagnetic (since it is two ferromagnetic layers (71) and (65) that are in contact).

Although the stitched configuration improves the performance of the sensor because of the improved current profile, the stabilization of the free layer is relatively poor, as can be seen by examining transfer curves (rotation of the free layer magnetic moment as a function of external magnetic field). Referring to FIG. 2 there is seen the simulated transfer curves of a stitched configuration for two currently achievable exchange fields between the free and bias layers obtainable for a free layer of 30 angstroms thick CoFe and a bias layer of between 45–60 angstroms of CoFe equivalent. The solid line curve represents an exchange field of 650 Oe, corresponding to a bias layer of magnetic thickness 1.5 times the magnetic thickness of the free layer. The broken line curve corresponds to an exchange field of 500 Oe representing a bias layer whose magnetic thickness is 2 times the magnetic thickness of the free layer.

In order to suppress the degree of hysteresis exhibited by the transfer curve it is found that an exchange field of at least 800 Oe is required for the 1.5× case and at least 1100 Oe is needed for the 2× case. It is the objective of this invention to provide a method for producing just such an increased exchange field within the stitched in-stack biasing configuration.

SUMMARY OF THE INVENTION

The first object of this invention is to provide an in-stack biased CPP synthetic spin-valve sensor in which the biasing exchange field is sufficiently enhanced to effectively stabilize the sensor free layer and to eliminate the problem of poor stabilization as indicated by open transfer curves.

The second object of this invention is to provide such a sensor in which a thicker free layer is thereby feasible.

The third object of this invention is to provide a method of making this sensor.

The fourth object of this invention is to provide such a method that allows the use of low field annealing to set the required layer magnetizations.

A fifth object of this invention is to provide such a method that can also be applied to the formation of other configuratiions, such a tunneling magnetoresistive sensors (TMR).

These objects will be achieved by coupling the portion of the biasing layer within the pillar, denoted LBL, to the stitched portion of the biasing layer by means of a synthetic exchange pinning structure rather than by a direct ferromagnetic-to-ferromagnetic coupling as is used in the prior art stitched in-stack configuration of FIG. 1b. Therefore, the portion of the biasing layer within the stitched portion of the sensor will be formed as a tri-layer, in which two layers of ferromagnetic material (denoted FM1 and FM2) are separated by a thin, non-magnetic spacer layer, such as a layer of Ru or Rh, and the layers are magnetized in anti-parallel directions, with the layer proximate to the portion of the bias layer within the pillar (FM1) being magnetized parallel to that pillar portion (LBL). The tri-layer is itself pinned by an antiferromagnetic layer formed on FM2 and the entire fabrication is covered with a capping or conducting lead layer. Compared with the stitched formation of FIG. 1b, the sum of the magnetic thicknesses of the LBL and FM1 layers (t(LBL)+t(FM1)) can be as large as 70 angstroms of CoFe, while the thickness of FM2 (t(FM2)) can be between approximately 80–90 angstroms of CoFe, thereby producing the desired exchange field. The choice of magnetic thicknesses of the layers is critical to the invention for the following reasons. By choosing t(LBL)+t(FM1)<t(FM2) at least three advantageous results can be achieved:

1) A thicker t(FM2) can yield a higher pinning field than a thinner t(FM2).
2) The in-stack synthetic bias pinning layer can have its magnetization set with low field annealing.
3) Since the magnetization direction of the free layer is the same as that of FM2, a low field anneal will not affect the free layer magnetization.

It has been shown that by choosing the ratio of t(LBL)+t(FM1) to t(FM2) to be 70/90 angstroms of CoFe, also producing an LBL to free layer magnetic moment ratio of 1.7, an exchange field greater than 1500 Oe can be obtained, which corresponds to the experimentally measured R-H curve of FIG. 4. It is also seen from the transfer curve of FIG. 5 that the desired closing of the transfer curve has been obtained. It is clear from the steps of the entire process that the method can be equally well applied to the formation of a tunneling junction magnetic sensor.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figure, wherein:

FIGS. 1a and b are schematic drawings of the ABS plane of an in-stack biased CPP synthetic spin-valve sensor in a pillar configuration (1a) and in a stitched configuration (1b).

DESCRIPTION OF THE PREFERRED EMBODIMENTS

The present invention provides a CPP synthetic spin-valve sensor having a stitched configuration, a pillar portion on which is formed a portion of larger cross-sectional area. The longitudinal bias layer within this sensor is formed in two portions: one portion being within the pillar, proximate to the free layer but separated from it by a decoupling layer to prevent exchange coupling between the biasing layer and the free layer, the other portion being a tri-layer entirely within the stitched portion of the sensor, which tri-layer acts as a synthetic pinning structure.

Figure 2:
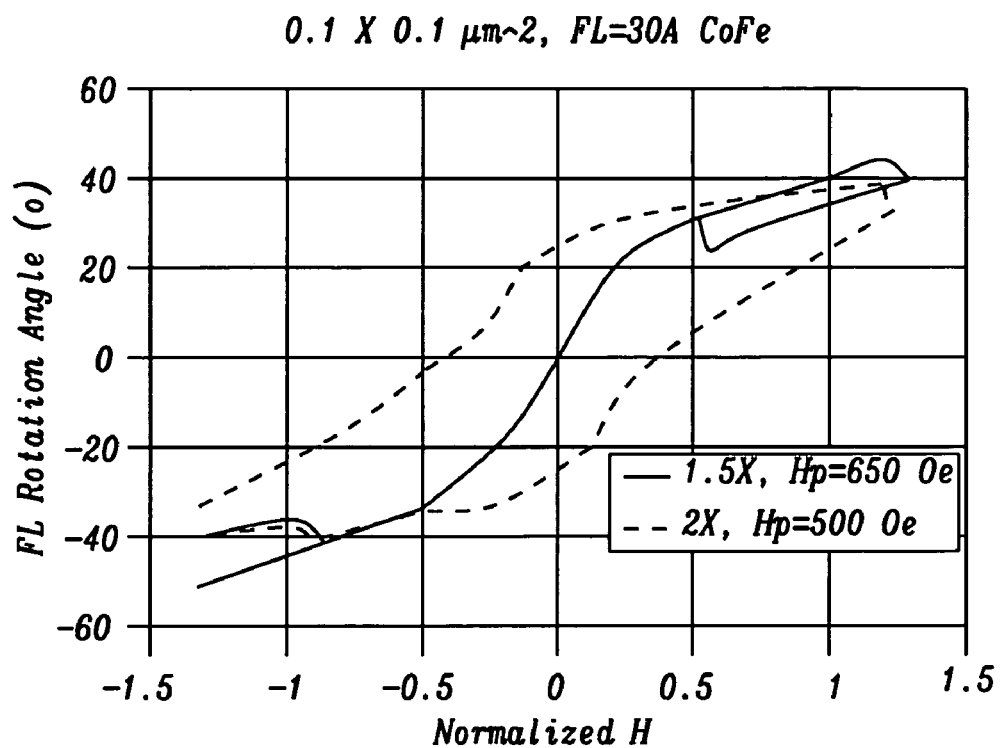
FIG. 2 is a schematic graphical depiction of the transfer curves of a stitched configuration as in FIG. 1b showing hysteresis.
Figure 3A:
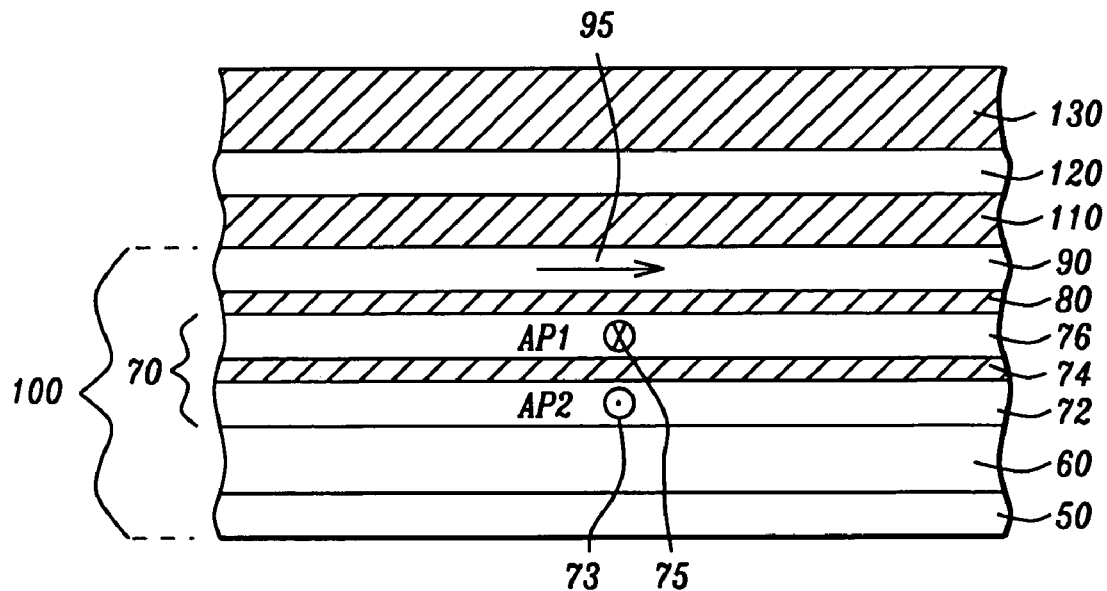
FIGS. 3a through 3d are schematic ABS plane views showing four steps in the formation of a stitched configuration analogous to that in FIG. 1b, except the biasing layer is formed in accord with the present invention.

Referring now to FIG. 3a, there is shown an ABS cross-sectional view of the configuration of layers (the stack) that will become the pillar portion of the sensor. This portion comprises the CPP synthetic spin-valve portion (SySV) (100), on which is formed the decoupling layer (110), the LBL layer (120) and a first capping layer (130). The decoupling layer is a trilayer of Cu/Ta/Cu, wherein both Cu layers are between approximately 4 and 6 angstroms with 5 angstroms being preferred and the Ta layer is between approximately 4 and 15 angstroms with approximately 8 angstroms being preferred. The LBL layer is a layer of ferromagnetic material such as CoFe formed to a thickness between approximately 70–80 angstroms. The first capping layer is a layer of Ru, formed to a thickness between 40 and 60 angstroms with 50 angstroms being preferable. The magnetic thickness of the LBL will have to conform to the relationship determining the ratio of thickness of the LBL+FM1 to FM2.

The CPP SySV (100) is itself formed as a seed layer (50), an antiferromagnetic pinning layer (60), which is typically a layer of IrMn formed to a thickness of approximately 70 angstroms, a synthetic antiferromagnetic (SyAF) pinned layer (70), a non-magnetic spacer layer (80) and a ferromagnetic free layer (90). The SyAF (70) is a trilayer comprising a first ferromagnetic layer (denoted AP1) (72), a second ferromagnetic layer (denoted AP2) (76) and a coupling layer (74) of approximately 4 angstroms of Ru or approximately 5 angstroms of Rh formed between them.

The free layer (90) is preferably a laminated structure of the following form:

CoFe10/Cu3/CoFe10/Cu3/CoFe10 where the numbers refer to preferred thicknesses in angstroms, but wherein the CoFe can be formed within a range of thicknesses between approximately 7 and 15 angstroms and the Cu can be formed within a range of thicknesses between approximately 1 and 4 angstroms. Note, hereinafter CoFe refers to Co(90%)Fe(10%) and FeCo refers to Fe(50%)Co(50%), the percentages referring to percent of the number of atoms of each element of the alloy.

Within the SyAF pinned layer (70), the first ferromagnetic layer AP1 (76) is preferably a laminated structure of the form:

AP1: CoFe10/Cu3/CoFe10/Cu3/CoFe10 where the numbers refer to preferred thicknesses in angstroms, but wherein the CoFe can be formed within a range of thicknesses between approximately 8 and 15 angstroms and the Cu can be formed within a range of thicknesses between approximately 1 and 4 angstroms.

Also within the SyAF pinned layer the second ferromagnetic layer AP2 (70) is preferably a laminated structure of the form:

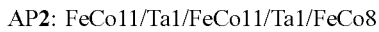
AP2: FeCo11/Ta1/FeCo11/Ta1/FeCo8 where the numbers refer to preferred thicknesses in angstroms, but wherein the FeCo can be formed within a range of thicknesses between approximately 5 and 15 angstroms and the Ta can be formed within a range of thicknesses between approximately 0.5 and 3 angstroms.

Subsequent to the stack formation, the magnetizations of AP1, AP2 and the free layer are set. AP1 and AP2 are set in antiparallel directions perpendicular to the ABS plane (the plane of the figure), the directions being indicated by symbolic circles (73, 75). The magnetization requires an anneal at a temperature of approximately 280° C. for approximately 5 hours in a magnetic field of approximately 10 kOe perpendicularly directed. The magnetization of the free layer (90) is set in the longitudinal direction (arrow (95)), perpendicularly to the SyAF layer in an anneal at approximately 230° C. for approximately 30 minutes in a longitudinal field of approximately 350 Oe.

Figure 3B:
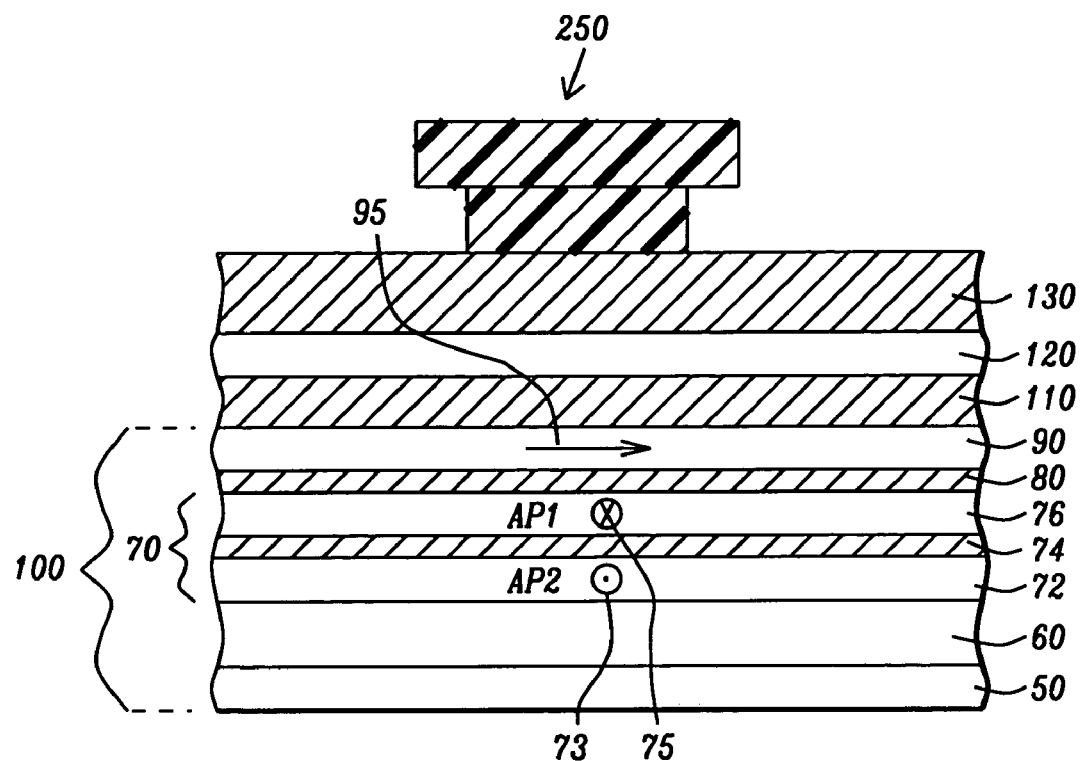

Referring now to FIG. 3b, there is shown the stack of FIG. 3a, subsequent to the formation of a photolithographic etch mask (250) on the capping layer, which will be used to pattern the stack to form the narrow pillar shape of uniform lateral cross-sectional area. The patterning is accomplished in a manner known in the art by etching away portions of the stack laterally disposed to a region which will form the required pillar shape. The lateral dimension of the pillar will correspond to the desired trackwidth of the sensor. The same mask will be then be used as a deposition mask to refill the region surrounding the pillar with an insulating material such as alumina.

Figure 3C:
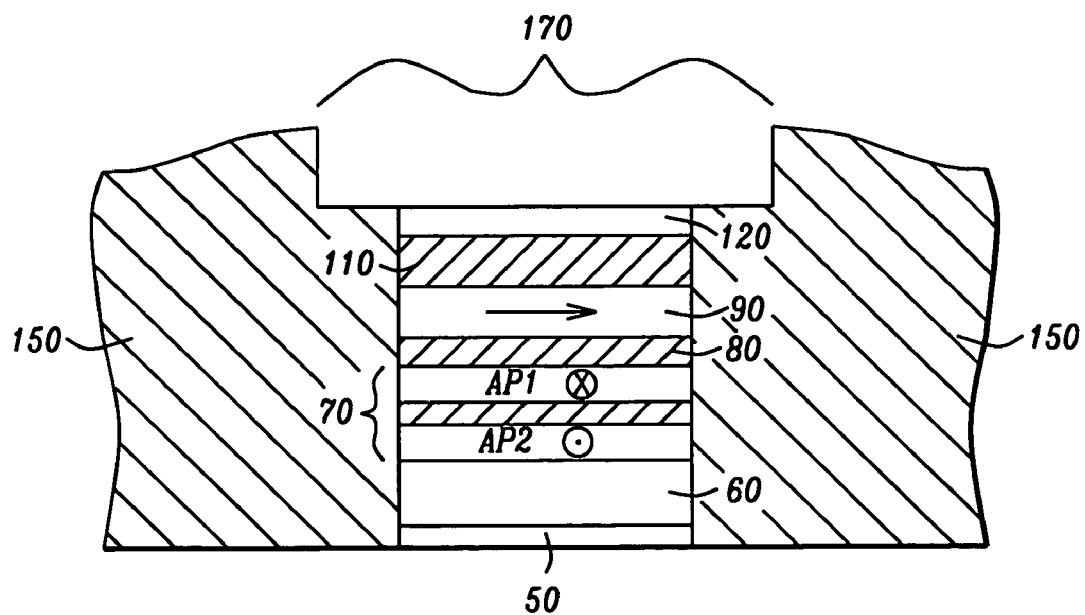

Referring next to FIG. 3c, there is shown the patterned stack surrounded by the refilled alumina or similar insulating material (150). The photolithographic mask has been removed. An etching process, such as a plasma etch or an ion-beam etch (IBE) removes the capping layer ((130) in FIG. 3a) and an approximate 10–20 angstrom thick upper portion of the LBL (120).

Figure 3D:
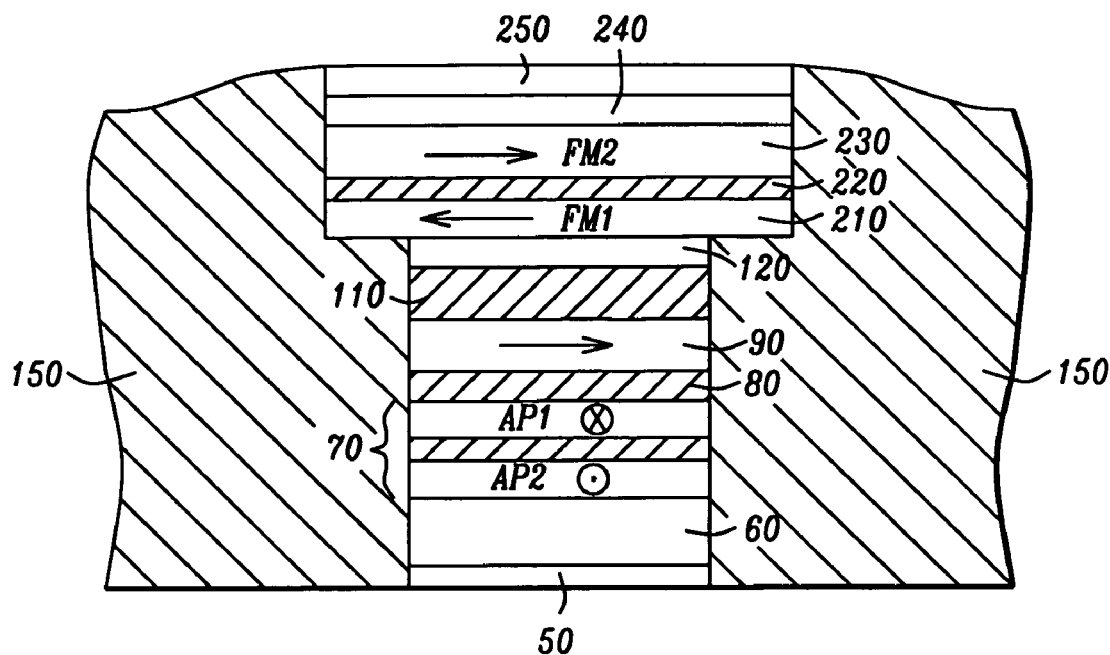
Figure 4:
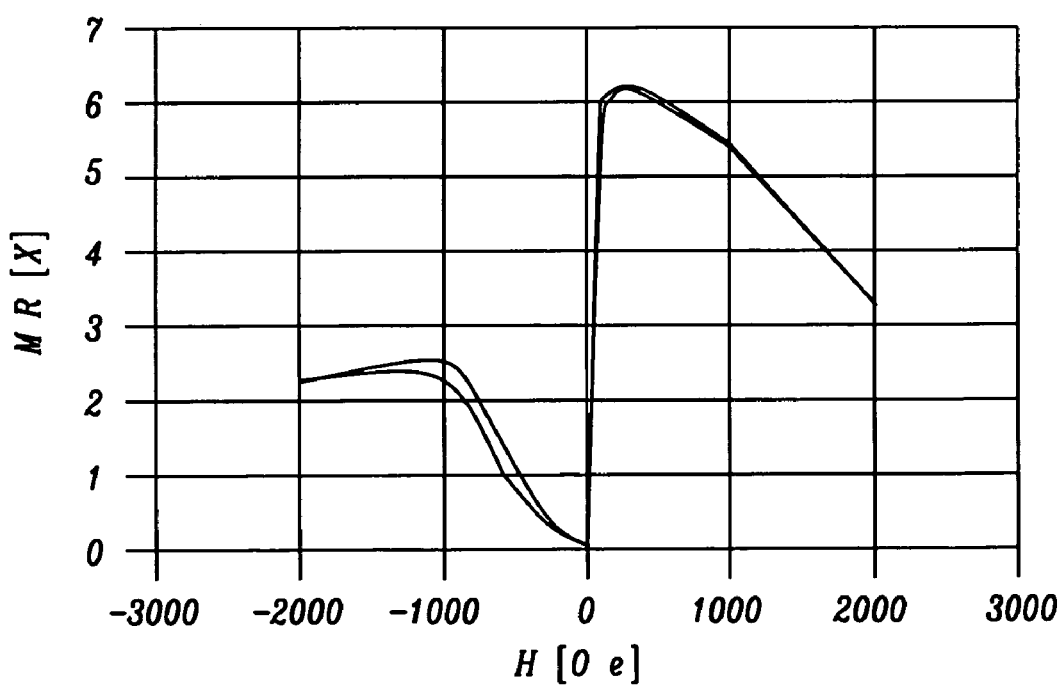
FIG. 4 is a graph of sensor magnetoresistive ratio vs. external field for the present invention, showing a strong exchange field.
Figure 5:
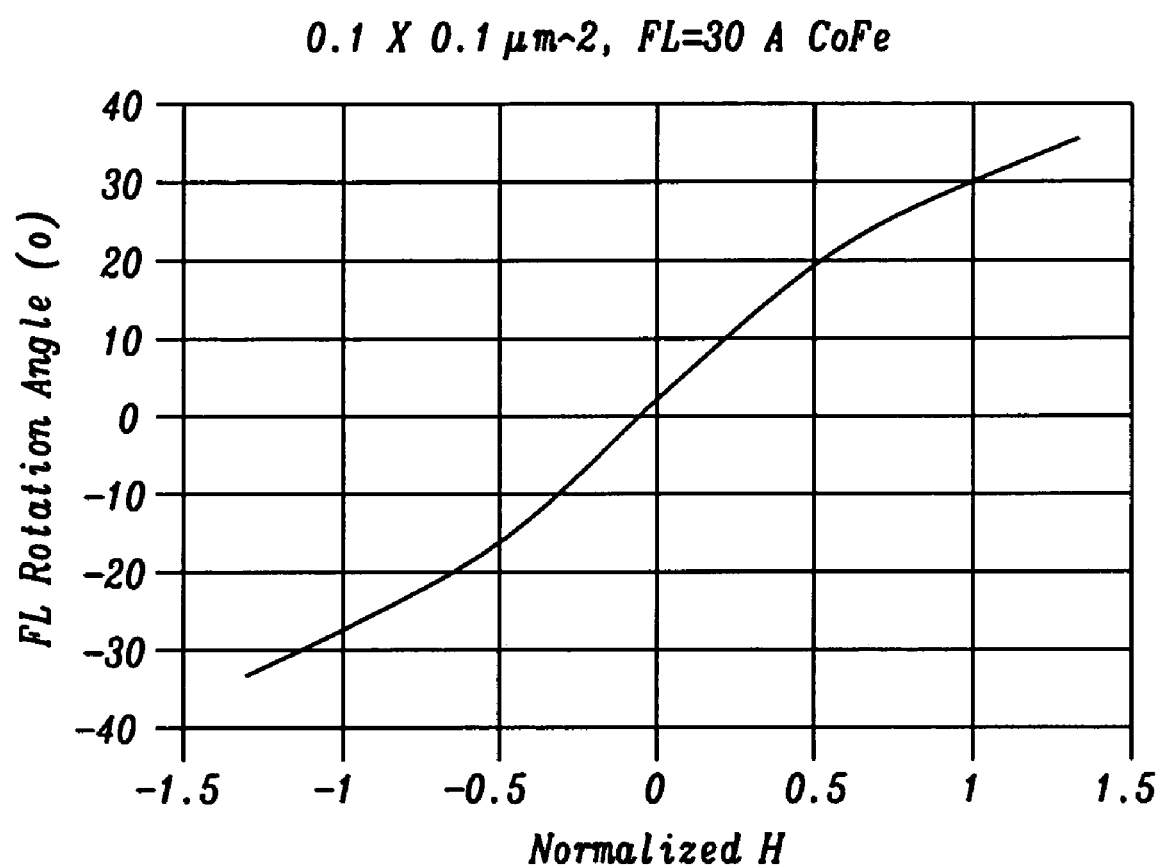
FIG. 5 is a simulated transfer curve for the sensor of the present invention, showing closure of the curve.

Referring next to FIG. 3d, there is shown the fabrication of FIG. 3b wherein the stitched layers have been sequentially formed. There is shown the FM1 layer (210), which is formed on the LBL (and which is directly exchange coupled to it), and which is a layer of ferromagnetic material such as FeCo, formed to a thickness of between approximately 5 and 10 angstroms, with approximately 10 angstroms being preferred. On this layer is then formed a coupling layer (220) of Ru or Rh, the preferred Ru layer being formed to a thickness between approximately 3 and 5 angstroms, with 4 angstroms being preferred. On the coupling layer is then formed the FM2 layer (230), which is, preferably, a bilayer of CoFe70/FeCo10, the CoFe being preferably formed to a thickness range between approximately 60 and 90 angstroms with approximately 70 angstroms being preferable and the FeCo being formed to a thickness range between approximately 5 and 20 angstroms with approximately 10 angstroms being preferable. Note that CoFe means Co(90%)Fe(10%) and FeCo means Fe(50%)Co(50%), the percentages being atom percents. The three layers (210, 220 and 230) constitute the pinning tri-layer (300) that will pin the magnetization of the LBL layer within the pillar portion of the stack and thereby allow magnetostatic coupling between FM1/LBL and the free layer. On FM2 there is then formed a pinning layer (240) to pin the magnetization of FM2 of the tri-layer. This pinning layer is a layer of an antiferromagnetic material such as IrMn formed to a thickness between approximately 40 and 70 angstroms. On this layer is then formed a second capping layer and/or a conducting lead layer (250), which can be a layer of Ru, Ta or NiCr, formed to a thickness between approximately 30 and 100 angstroms. After the formation of the stitched layer is complete, the fabrication is subjected to a low field annealing at approximately 230° C. for approximately 30 minutes in a magnetic field of approximately 350 Oe to set the magnetizations of the tri-layer. The magnetizations are longitudinally directed, with FM1 and FM2 being antiferromagnetically coupled and magnetized in opposite directions (antiparallel), with the magnetization of FM1 being parallel to the magnetization of LBL and exchange coupled to LBL, and with the magnetization of FM2 being parallel to the magnetization of the free layer.

It is to be noted that the materials and thickness ranges provided for the formation of the LBL layer, and the FM1 and FM2 layers given above satisfy the criterion that:

[t(LBL)+t(FM1)]/t(FM2)=70/90 angstroms CoFe to produce the required strong exchange pinning and to produce an LBL to free layer moment of approximately 1.7.

As is understood by a person skilled in the art, the preferred embodiment of the present invention is illustrative of the present invention rather than limiting of the present invention. Revisions and modifications may be made to methods, materials, structures and dimensions employed in fabricating a stitched, in-stack stabilized CPP synthetic spin-valve sensor, while still providing a method for fabricating a stitched, in-stack stabilized CPP synthetic spin-valve sensor in accord with the spirit and scope of the present invention as defined by the appended claims.

What is claimed is:

1. A stitched in-stack stabilized CPP synthetic spin-valve sensor comprising:
   a multi-layered pillar type synthetic spin-valve formation, said pillar being defined by a common and uniform lateral cross-section of all included layers and said formation having a longitudinally magnetized ferromagnetic free layer as its uppermost layer;
   a decoupling layer formed on said free layer, said decoupling layer having the same lateral cross-sectional area as said spin-valve formation;
   a longitudinal bias layer (LBL) formed on said decoupling layer, said LBL having the same lateral cross-section as said decoupling layer;
   a multi-layer formation stitched onto said LBL, said formation being characterized by a larger lateral cross-section than said LBL and said formation including:
      a synthetic exchange tri-layer formation;
      an antiferromagnetic pinning layer formed on said tri-layer formation;
      a capping and conducting lead layer formed on said pinning layer; and
   wherein said tri-layered structure and said LBL are longitudinally magnetized and strongly exchange coupled to said free layer and, thereby, stabilize it.

2. The sensor of claim 1 wherein said synthetic spin-valve formation further comprises:
   a seed layer;
   an antiferromagnetic pinning layer formed on said seed layer;
   a synthetic antiferromagnetic pinned layer formed on said pinning layer, said layer comprising a first (AP1) and a second (AP2) laminated ferromagnetic layer, wherein each said layer is magnetized in opposite directions transversely to the ABS of the sensor, said layers being separated by a non-magnetic layer;
   a non-magnetic spacer layer formed on said pinned layer; and
   a longitudinally magnetized ferromagnetic free layer formed on said spacer layer.

3. The sensor of claim 2 wherein said first ferromagnetic layer is the lamination CoFe/Cu/CoFe/Cu/CoFe, wherein the CoFe lamina are formed to a thickness between approximately 7 and 15 angstroms and the Cu lamina are formed to a thickness between approximately 1 and 4 angstroms.

4. The sensor of claim 2 wherein said second ferromagnetic layer is the lamination FeCo/Ta/FeCo/Ta/FeCo wherein the FeCo lamina are formed to a thickness between approximately 5 and 15 angstroms and the Ta lamina are formed to a thickness between approximately 0.5 and 3 angstroms.

5. The sensor of claim 1 wherein said decoupling layer is a tri-layer of non-magnetic materials comprising:
   a first layer of Cu of thickness between approximately 4 and 6 angstroms;
   a layer of Ta of thickness between approximately 4 and 15 angstroms;
   a second layer of Cu of thickness between approximately 4 and 6 angstroms.

6. The sensor of claim 1 wherein said LBL is a layer of FeCo formed to a thickness between approximately 40 and 50 angstroms.

7. The sensor of claim 1 wherein said free layer is the lamination CoFe/Cu/CoFe/Cu/CoFe wherein the CoFe lamina are formed to a thickness between approximately 7 and 15 angstroms and the Cu lamina are formed to a thickness between approximately 1 and 4 angstroms.

8. The sensor of claim 1 wherein said synthetic exchange tri-layer formation comprises:
   a first ferromagnetic layer, FM1, formed on said LBL;
   a coupling layer formed on FM1;
   a second ferromagnetic layer, FM2, formed on the coupling layer; and
   FM1 and FM2 are longitudinally magnetized in antiparallel directions, FM1 and LBL are magnetized in the same direction and FM2 and said ferromagnetic layer are magnetized in the same direction.

9. The sensor of claim 8 wherein the magnetic thicknesses of FM1, FM2 and LBL satisfy the relationships: t(LBL)+t(FM1)<t(FM2) and [t(LBL)+t(FM1)]/t(FM2)=70/90 angstroms of CoFe.

10. The sensor of claim 8 wherein FM1 is a layer of FeCo formed to a thickness between approximately 5 and 20 angstroms, FM2 is a bilayer of CoFe/FeCo, wherein the CoFe is formed to a thickness between approximately 60 and 90 angstroms and the FeCo is formed to a thickness between approximately 5 and 20 angstroms and the coupling layer is a layer of Ru formed to a thickness between approximately 3 and 5 angstroms.

* * * * *